(12) United States Patent
Hsueh et al.

(10) Patent No.: US 9,280,412 B2
(45) Date of Patent: Mar. 8, 2016

(54) MEMORY WITH ERROR CORRECTION CONFIGURED TO PREVENT OVERCORRECTION

(71) Applicant: MACRONIX INTERNATIONAL CO., LTD., Hsinchu (TW)

(72) Inventors: Wen-Feng Hsueh, Hsinchu (TW); Ming-Chao Lin, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 292 days.

(21) Appl. No.: 13/890,698

(22) Filed: May 9, 2013

(65) Prior Publication Data

US 2014/0281803 A1    Sep. 18, 2014

Related U.S. Application Data

(60) Provisional application No. 61/776,812, filed on Mar. 12, 2013.

(51) Int. Cl.
*G11C 29/00* (2006.01)
*G06F 11/07* (2006.01)
*G06F 11/10* (2006.01)
*G11C 29/04* (2006.01)

(52) U.S. Cl.
CPC ........ *G06F 11/0793* (2013.01); *G06F 11/0751* (2013.01); *G06F 11/1048* (2013.01); *G11C 2029/0411* (2013.01)

(58) Field of Classification Search
CPC . G06F 11/10; G06F 11/1048; G06F 11/1008; G11C 13/0004; G11C 29/028; G11C 13/004; G11C 29/021; G11C 29/026; G11C 13/0038
See application file for complete search history.

(56) References Cited

U.S. PATENT DOCUMENTS

| 4,692,893 A | 9/1987 | Casper |
| 6,992,932 B2 | 1/2006 | Cohen |
| 2004/0136236 A1* | 7/2004 | Cohen ........................ 365/185.2 |
| 2013/0159796 A1* | 6/2013 | Bedeschi ...................... 714/708 |

OTHER PUBLICATIONS

Polansky, Yan, et al., "A 4b/cell NROM 1Gb Data-Storage Memory," ISSCC 2006, Session 7/ Non-Volatile Memory/ 7.1, Jan. 2006, 11 pages.
Shibata, N., et al., "A 19nm 112.8mm2 64Gb Multi-Level Flash Memory with 400 Mb/s/pin 1.8V Toggle Mode Interface," ISSCC 2012, Session 25, Non-Volatile Memory Solutions, 25.1, Feb. 22, 2012, 3 pages.
Tanakamaru, Shuhei, et al., "Over-10x-Extended-Lifetime 76%-Reduced-Error Solid-State Drives (SSDs) with Error-Prediction LDPC Architecture and Error-Recovery Scheme," ISSCC 2012, Session 25, Non-Volatile Memory Solutions, 25.2, Feb. 22, 2012, 3 pages.

* cited by examiner

*Primary Examiner* — April Y Blair
*Assistant Examiner* — Thien D Nguyen
(74) *Attorney, Agent, or Firm* — Yiding Wu; Haynes Beffel & Wolfeld LLP

(57) ABSTRACT

A non-volatile memory array storing data and ECCs includes error correcting logic. A data set can be read by performing iterations including sensing data using a read bias, and producing an indication of errors in the sensed data. A first iteration uses a first read bias. In each iteration, if the indication in a current iteration is less than a threshold, then the data is output from the selected cells sensed in the present iteration. If the indication in the current iteration exceeds the threshold, then another iteration is performed using a moved read bias, unless the indication in the current iteration shows an increase in errors relative to a previous iteration, in which case then sensed data from the previous iteration is output. Double buffering logic can be used to store sensed data during a current and a previous iteration.

6 Claims, 5 Drawing Sheets

MEMORY WITH ERROR CORRECTION CONFIGURED TO PREVENT OVERCORRECTION

RELATED APPLICATIONS

This application claims the benefit of U.S. Provisional Patent Application No. 61/776,812 filed on 12 Mar. 2013, and said application is incorporated by reference as if fully set forth herein.

BACKGROUND OF THE INVENTION

1. Field of the Invention

The present invention relates to memory devices and systems including error correction code (ECC) logic.

2. Description of Related Art

Memory technologies used for integrated circuit memories are being developed at smaller and smaller technology nodes, and are being deployed on larger and larger memory arrays on a single integrated circuit. As the technology for memory cells advances, the margins for sensing the data can become tighter. Also, the ability of the memory cells to hold data values in the presence of disturbance of the memory cell state caused by high speed and high volume accesses to the memory cells and to neighboring memory cells can be limited by the tighter margins.

To address issues like those that arise from tighter sensing margins and memory cell disturbance, as these technologies scale in size and density, use of error correcting codes (ECCs) and supporting logic embedded with integrated circuit memory has become more widespread.

In some systems, the threshold voltage, or other sensing conditions, of memory cells can drift over time, or with cycling of the data. Technology has been proposed to account for this drift in the reading and programming operations by moving the read bias conditions to match the drift. See for example, U.S. Pat. No. 6,992,932 by Cohen, and Polansky et al., "A 4b/cell NROM 1 Gb Data-Storage Memory," ISSCC 2006, Session 7/Non-Volatile Memory/7.1, January 2006.

Notwithstanding the range of error correction technologies, error rates can still limit the usefulness of existing memory technologies, and slow the adoption of new memory technologies. Thus, it is desirable to improve error correction technologies as applied to memory devices.

SUMMARY

Memory devices and methods of operating a memory, are disclosed. An operating method described comprises reading a data set from the memory by performing iterations, where an iteration includes sensing data in selected cells using a read bias, and producing an indication of errors in the sensed data. If the indication in a current iteration is less than a threshold, then data from the selected cells sensed in the current iteration is used. If the indication in the current iteration exceeds the threshold, then another iteration is performed using a moved read bias. However, if the indication in the current iteration shows an increase in errors relative to a previous iteration, then a "backward move" is used so that data from the selected cells sensed using a read bias equal to, or closer to, the first read bias is can be output. As a result, over-correction of the read bias conditions is compensated for, or prevented.

An example of a method of operating a memory device, implementing a "backward move," includes:

reading a data set from the memory by performing iterations including sensing data in selected cells using a read bias, and producing an indication of errors in the sensed data, where a first iteration uses a first read bias; then if the indication in the first iteration is less than a threshold, then outputting the data from the selected cells sensed in the first iteration;

if the indication in the first iteration exceeds the threshold, then moving the read bias and performing a second iteration, then if the indication in the second iteration is less than the threshold, then outputting the data from the selected cells sensed in the second iteration;

if the indication in the second iteration shows an increase in errors relative to the first iteration, then outputting data from the selected cells sensed in the first iteration.

The method can include additional iterations as necessary.

Other aspects and advantages of the present invention can be seen on review of the drawings, the detailed description and the claims, which follow.

DETAILED DESCRIPTION

A detailed description of embodiments of the present invention is provided with reference to the FIGS. 1-7.

Figure 1:
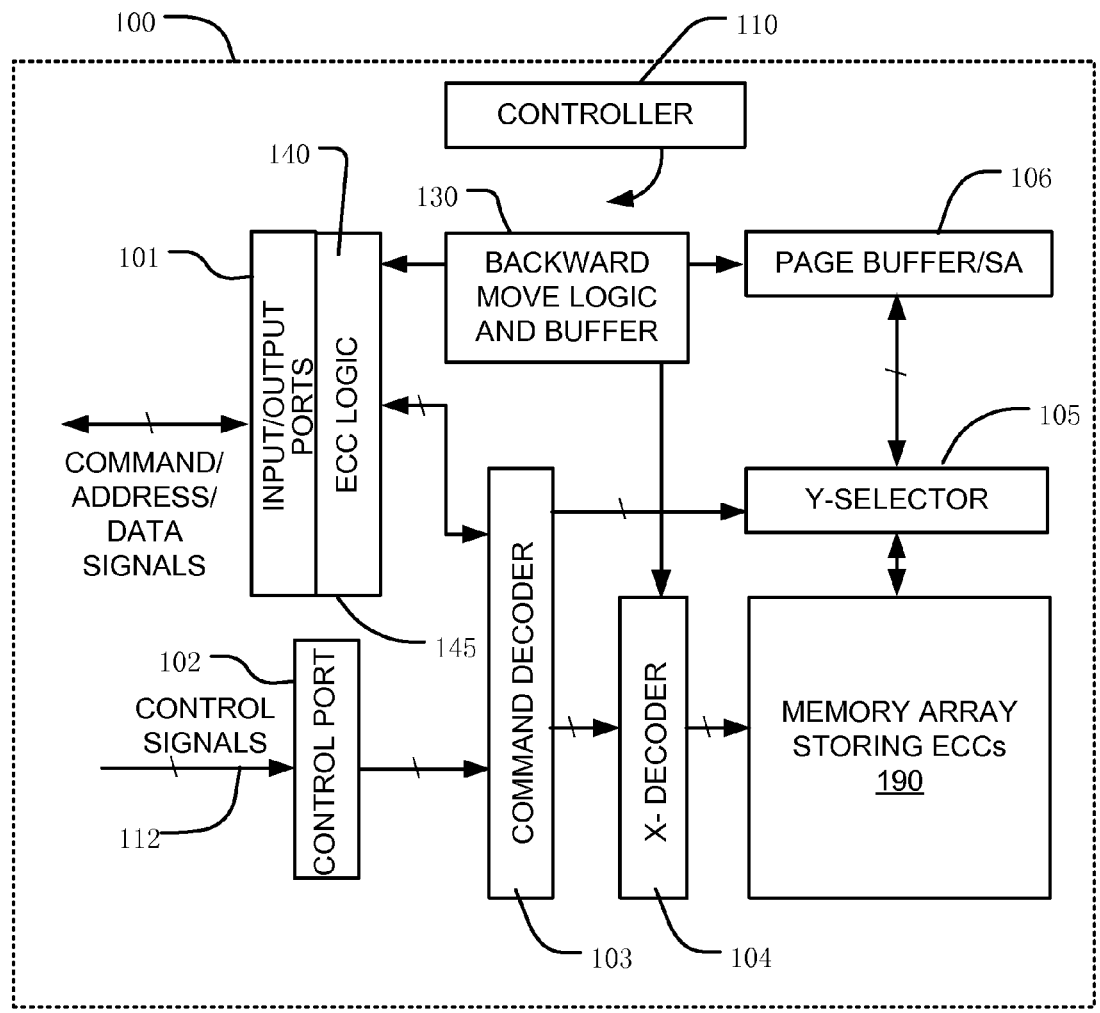
FIG. 1 is a block diagram of a memory device including backward move logic.

FIG. 1 is a block diagram of a memory device 100 including a memory array 190 storing error correcting codes ECCs for corresponding data.

The memory device 100 includes an input/output ports 101, and a control port 102. The control port 102 includes circuits that receive control signals 112 in communication with external devices, including such control signals as chip enable signals, read enable signals, write enable signals, command enable signals, address enable signals, clock signals, etc. The input/output ports 101 functions as the input port or the output port of the memory device 100, depending on values of the control signals 112 received at the control port 102. The input/output ports 101 includes circuits that receive input signals and transmit output signals. The input signals may include command signals, address signals, and input data signals.

A command decoder 103 is coupled to the input/output ports 101, and the control port 102, which detects and causes execution of commands for operating the memory device 100, including read commands and write commands. Write commands are called, or can include, program and erase commands in some technologies. The command decoder 103 is in turn coupled with a row decoder (X-decoder) 104 and a column selector (Y-selector) 105 for access to the memory array 190. In this example, a page buffer 106 including (or coupled to) sense amplifiers, supporting page read and page write operations. The page buffer 106 is coupled to the memory array through the column selector 105. The page buffer is in turn accessible by "backward move" logic 130, by the input/output ports 101, and by the ECC logic 140.

The ECC logic 140 is operable to detect and correct errors in the corresponding data using the ECCs associated with the data in the memory array.

A controller 110 is coupled to the memory array 190, the ECC logic 140, and the backward move logic, as well as other components in the device.

The controller 110 can include one or more state machines, register files, and other logic circuitry that are deployed to execute the functions of the memory, including the read and write functions. The controller 110 can be implemented using one or more dedicated logic circuits, programmable gate array circuits, a programmable processor with associated software, or combinations of these types of circuits. In some implementations, parts of the controller functionality can be implemented off of the memory device 100, in hardware or software associated with the memory controller or a host processor for example.

The ECC logic 140, is coupled with the input/output ports 101 in this example. During a write operation, addressing a block of data in the memory array 190, the ECC logic 140 computes an ECC code to be stored in association with the block of data. During a read operation addressing a block of data in the memory array 190, the data from the addressed block and the stored ECC code for the block is read from the memory array 190. The ECC logic 140 detects whether the addressed block of data contains any errors, and whether the detected errors can be corrected. The number of errors and whether the errors can be corrected in the error checked block of data in a given implementation depends on the type of ECC code utilized. If the error can be corrected, then the corrected data from the ECC logic 140 may be combined with the data from the addressed block, and provided as output.

The ECC logic 140 on the memory device can support any suitable ECC scheme. Representative ECC schemes include Hamming code, extended Hamming code, multi-dimensional parity-check code, Reed-Solomon code, BCH code (Bose-Chaudhuri-Hocquenghem), Turbo code, and low-density parity-check code. The length of the error correcting code ECC associated with a particular data set depends on 3 factors: (1) ECC scheme; (2) Maximum corrected bit number; (3) Data length of one page. The BCH code is a class of cyclic error-correcting codes that can correct multiple bit errors. For example, to provide maximum corrected bit number of 40 bits in a page of 8 kilobits of data, the length of the BCH ECC code is 560 bits. For another example, to provide maximum corrected bit number of 24 bits in an 8 kilobits page, the length of the BCH ECC code is 336 bits. The choice of ECC scheme depends on a number of factors, including performance specifications, the amount of memory space available for error detecting and error correcting codes, device layout considerations and other factors. Devices including the technology described herein can synergistically include both ECC logic and backward move logic 130. In some embodiments, the backward move logic 130 can be applied without ECC logic.

As used in the present description, a bit is the basic unit of digital data in the memory array. A bit can have only two possible values: either digital one (1) or zero (0). A byte is a unit of digital data in the memory array. A byte may contain multiples of bits, such as 8 bits. A word is a unit of digital data in the memory array. A word may contain multiples of bytes, such as 4 bytes or 8 bytes corresponding to 32 bits, or 64 bits if a byte has 8 bits. A page is the basic set of data associated with an ECC, and in some implementations, can be stored in the memory array arranged to be read in response to a single read command. A page may have a fixed size such as 2,112 bytes where each byte has 8 bits.

The backward move logic 130, which can include a buffer in some examples, can be considered a module within the controller 110, or a separate module, and supports in cooperation with the controller 110, read and write operations that are able to move bias conditions used to access data in the array to reduce errors before delivering data from the array 190 to the ECC logic 140. The device associates an error detection codes with some or all of the chunks of data stored in the array. When used in association with ECC logic 140, the chunks of data having associated error detection codes can be the same as the page of data having an associated ECC. Other organizations of the chunks with respect to the ECC pages can be implemented as well.

The backward move logic 130 is configured to support an iterative read operation, where iterations in the operation includes sensing data in selected cells using a read bias and producing an indication of errors in the sense data. The indication of errors can be produced using the error detection codes. During the iterations, if the indication of errors indicates less than a threshold number of errors in the corresponding chunk data, then the data from the selected cells as sense during the current iteration is provided as output to the ECC logic 140 if any, or otherwise to the input/output ports 101. On the other hand, if the indication in the current iteration exceeds the threshold, then another iteration is performed using a moved read bias, unless the indication in the current iteration shows an increase in errors relative to a previous iteration. If there has been an increase in the errors, then the data from the selected cells sensed using a read bias equal to or closer to, the first read bias (such as the data from the immediately previous iteration) is applied as output. This can be characterized as a "backward move" of the read bias. In the event that a maximum number of iterations has been performed for a particular read operation, then the data sensed from the current iteration is provided as output, unless the logic indicates that there have been an increase in errors. For example, the logic can be configured to execute first, second and third iterations, if necessary.

The indication of errors can be produced by taking a difference in a count of bits at given value and comparing that count to an expected count. In other embodiments, the indication can be produced using a code to indicate (not necessarily accurately) a number of errors, such as a checksum based on byte parity, based on a modular sum, based on a cyclic redundancy check code, or other techniques. The expected count, or checksum, can be stored in the array, in a separate buffer on the device, or perhaps off chip in a manner accessible to the controller 110.

The implementation of the indication of errors can be selected according to design and specifications that involve the amount of space in the memory array available for storing counts or checksums, the specified speed for the read operation, device layout considerations, and other factors. It is desirable that the indication of errors be usable to determine whether the number of errors is equal to or less than the maximum number or errors correctable by the ECC scheme implemented for the memory in logic 140.

Advantageously, the chunk of data which is subject of a particular indication of errors can match, or be the same as an ECC page. Thus, a given ECC page may have both an ECC and an error detection code associated with it. Also, in this case, the threshold applied by the backward move logic can correspond with the number of errors that are correctable using the ECC technology applied for the array. A backward move can be applied in this configuration so that during a particular read operation all of the errors in the sense data can be corrected by the ECC logic 140, or at least it is very likely that all of the errors in the sense data can be corrected, unless the maximum number of retries has been reached. The backward move step can be implemented, as illustrated by embodiments described herein, so that the amount of time required for implementation is less than that required for another read operation.

Figure 2:
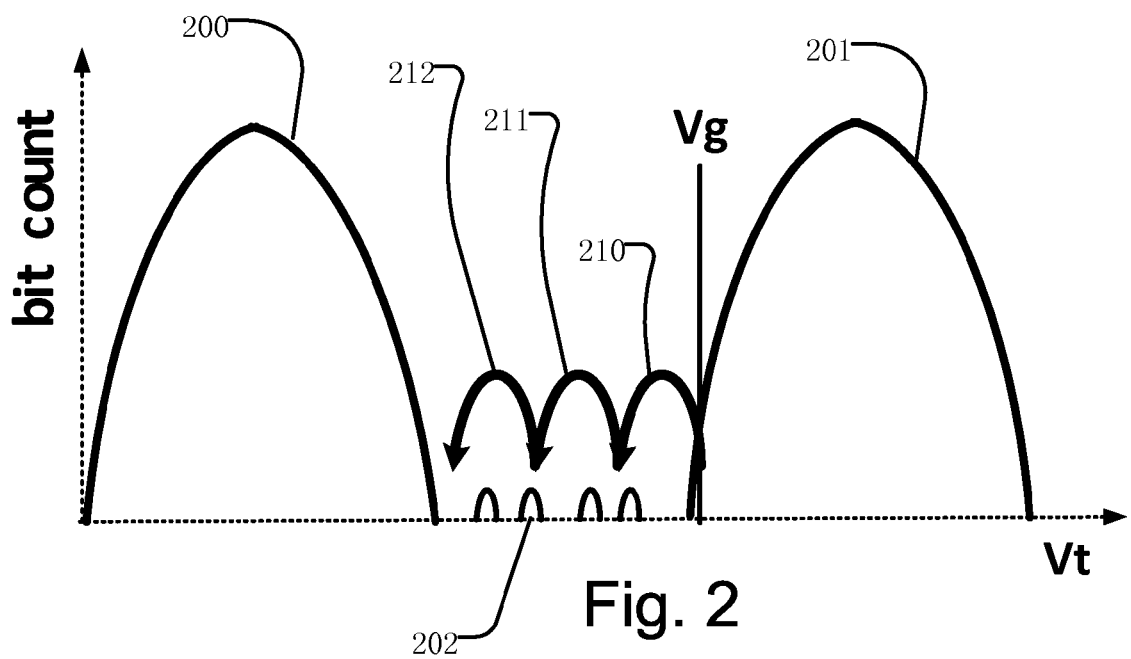
FIG. 2 is a graph of bit count versus threshold voltage showing threshold voltage distributions for single bit memory cells, which is referred to for the purposes of describing the read bias move technique.

FIG. 2 is a graph of bit count versus threshold voltage showing threshold voltage distributions for single bit memory cells, which is referred to for the purposes of describing the read bias move technique. For a single bit memory cell, the memory is designed to detect data when the threshold voltages of the memory cells in the array fall within two distinct threshold voltage ranges. A first lower threshold voltage range 200 and a second higher threshold voltage range 201 are separated, between the maximum value in the lower range, and the minimum value in the upper range by a read margin. Some memory cells may be improperly programmed, or unable to hold their threshold voltage values. Thus, the distribution can include a number of bits (e.g. 202) that fall inside the margin.

To read data in a selected cell, a read bias condition is applied that is configured to fall within the margin, so that the data values individual cells can be sensed. The read bias includes a gate voltage Vg applied to a word line, and corresponding bias conditions for the bit lines and other terminals of the memory cells as appropriate. In this example, the gate voltage Vg is one voltage which can be utilized to adjust a read bias condition.

If the threshold voltage distribution for the upper range 201 drifts, then the minimum value in the upper range 201 may fall near, or even below, the read bias. In FIG. 2, the gate voltage Vg is placed just above the minimum value of the upper range 201 to illustrate this condition.

According to a read bias move technique, the number of errors using the first read bias can be determined, and if that number exceeds a threshold, then the read bias can be moved (e.g. 210) to retry the read operation using a moved read bias. For example, the gate voltage can be decreased by 5 millivolts in each move. In an alternative where the sensing operation it is configured to sense whether the threshold lies below a given bias condition, then the gate voltage could be increased rather than decreased. To simplify the description, only embodiments in which the read bias is decreased are described in detail.

If the number of errors is below the threshold, then the sensed data can be output or provided to ECC logic as appropriate. This process can be repeated in an iterative fashion (210, 211, 212). At each iteration, the number of errors can be determined, and a decision made whether to proceed to the next iteration, or output the sensed data. In the example shown in FIG. 2, each iteration 210, 211, 212 results in moving the read bias below the threshold of additional cells which should be more properly classified in the higher threshold range. In this case, each iteration results in a reduction in the number of errors detected.

Figure 3:
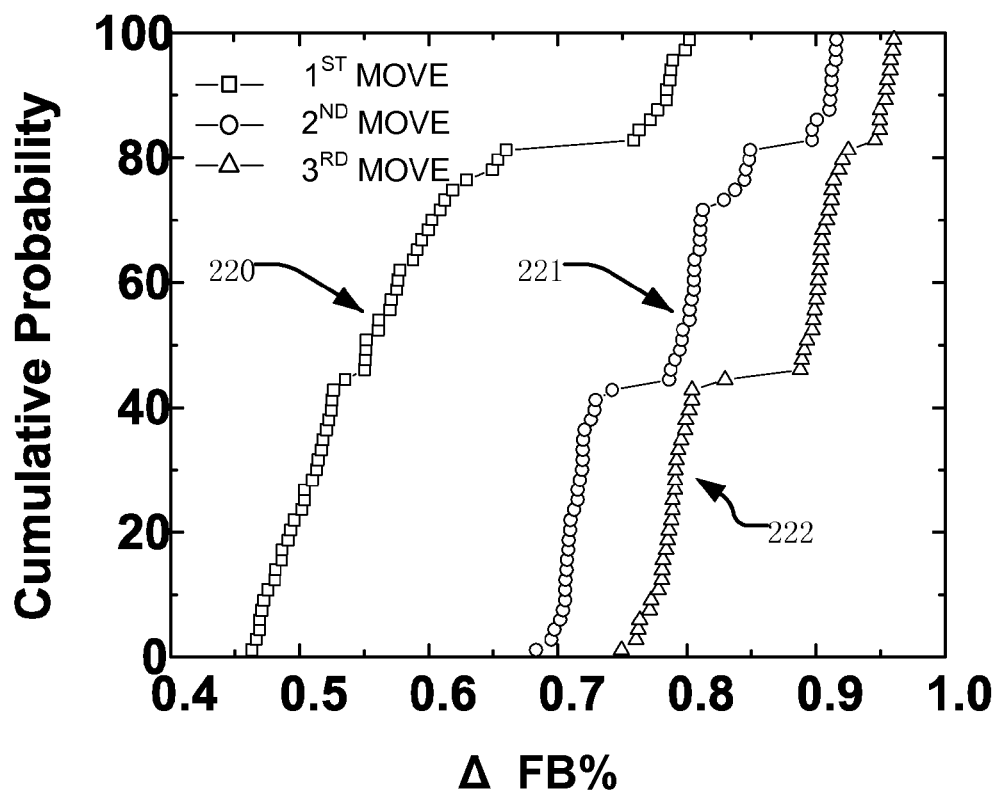
FIG. 3 is a graph showing performance of a read bias move technique like that illustrated with reference to FIG. 2.

FIG. 3 is a graph showing performance of a read bias move technique, such as the technique illustrated with respect to FIG. 2. In the test used to produce the results in FIG. 3, the number (FB) of failed bits was counted over a certain memory area, and the threshold number used for decision to move the read bias and perform another iteration was 6. The horizontal axis of the graph represents a change in the percentage of failed bits ΔFB % for a given read operation. This change in the number of failed bits is calculated for the purposes of this graph by taking the difference between a first number which is a count of failed bits which occur without ECC and without read bias move and a second number which is a count of failed bits which occur applying read bias move and ECC, and then dividing that difference by the first number.

$$\Delta FB\% = (FB_{(MOVE/ECC\ OFF)} - FB_{(MOVE/ECC\ ON)})/FB_{(MOVE/ECC\ OFF)}$$

The read bias move operation is designed to increase ΔFB %. The vertical axis represents the cumulative probability for a given read operation, where the cumulative probability means the probability in a given read operation that the ΔFB % will be a least as high as the corresponding value on the horizontal axis.

Thus as illustrated, the probability that a first move (such as move 210 of FIG. 2) will result in an increase in ΔFB % of a given amount, is illustrated on trace 220. The probability that a second move will result in an increase in ΔFB % of a given amount is illustrated on trace 221. The probability that a third move will result in an increase in ΔFB % is illustrated on trace 222. The trend shown in the graph of FIG. 3 shows an improvement for each move.

Figure 4:
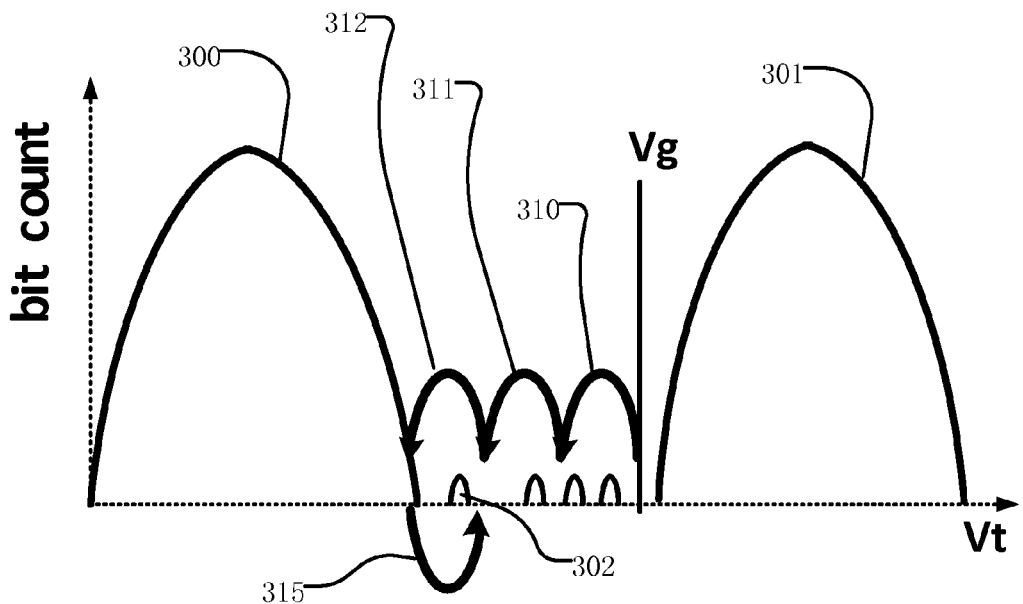
FIG. 4 is a graph of bit count versus threshold voltage showing threshold voltage distributions for single bit memory cells, which is referred to for the purposes of describing the read bias move technique with a backwards move.

FIG. 4 is a graph of discount versus threshold voltage like that of FIG. 2, illustrating move technique using larger read bias move steps (e.g. 7.5 the millivolts per move) in each iteration. The graph shows a lower threshold voltage range 300, and an upper threshold voltage range 301. The read bias includes a gate voltage located just below the minimum value of the upper threshold voltage range 301. A sequence of moves (310, 311, 312) of the gate voltage is executed in an attempt to reduce failed bit count. However, as illustrated in FIG. 4, the third move 312 can cause the read bias to cross over the maximum value of the lower threshold range 300. This will result in a large increase in the number of failed bits because the operation erroneously reads some of the memory cells in the lower threshold range 300 as occurring in the upper threshold range. As described herein, a backward move 315 can be used to recover the process. The backward move 315 may move the read bias above some of the bits (e.g. it's in the range 302) that should more properly fall within the upper threshold range. However, the result is improved relative to the last move in the sequence which resulted in a crash of the process.

Figure 5:
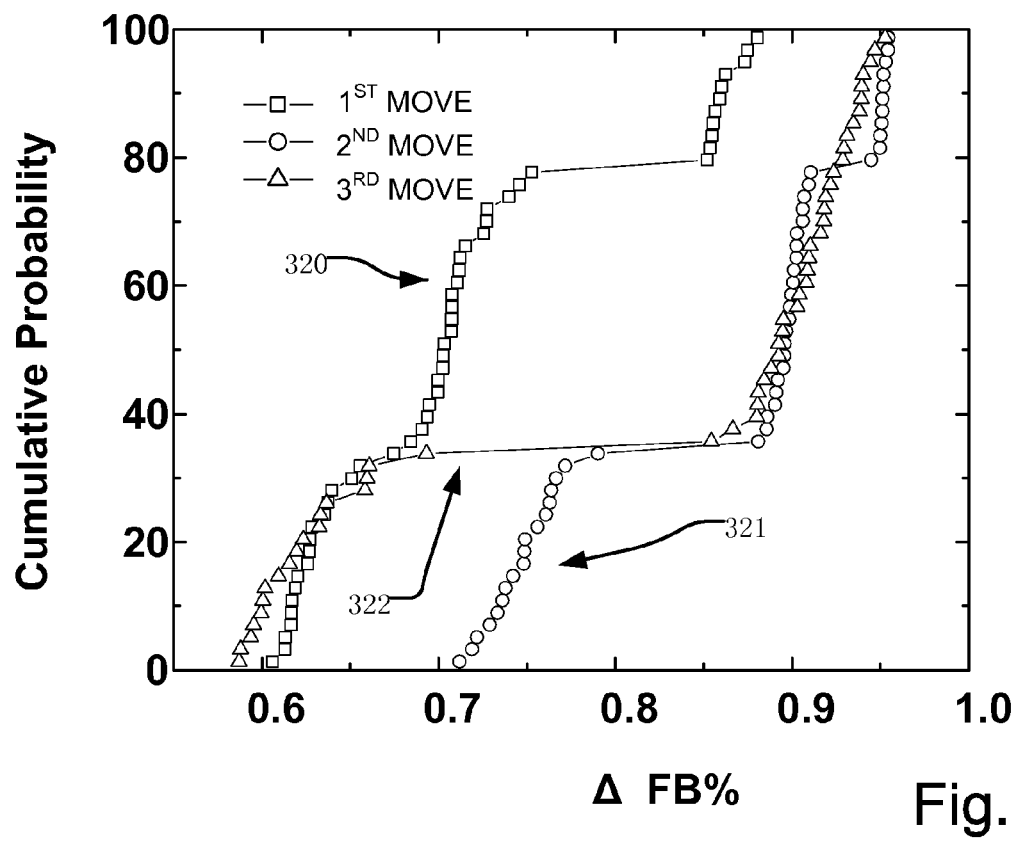
FIG. 5 is a graph showing performance of a read bias move technique like that illustrated with reference to FIG. 4, without a backwards move.

FIG. 5 is a graph like that of FIG. 3, showing performance of a read bias move technique such as the technique illustrated with respect to FIG. 4. The horizontal axis of the graph is the ΔFB %, as in the case of FIG. 3. The vertical axis of the graph is the cumulative probability, as in the case of FIG. 3.

Thus as illustrated, the probability that a first move (such as move 310 of FIG. 4) will result in an increase in ΔFB % of a given amount, is illustrated on trace 320. The probability that a second move will result in an increase in ΔFB % of a given amount is illustrated on trace 321. The probability that a third move will result in an increase in ΔFB % is illustrated on trace 322. The trend shown in the graph of FIG. 3 shows an improvement for the first and second moves (320, 321). However, with the third move (322), a significant likelihood is shown that the ΔFB % will decrease with the third move as illustrated by the fact that between 30 and 40% of the time the improvement in failed bit count is worse after the third move then it is after the second move, and significant likelihood that there will be no improvement. Thus the third move in this example should be corrected by a backward move (315 of FIG. 4).

Figure 6:
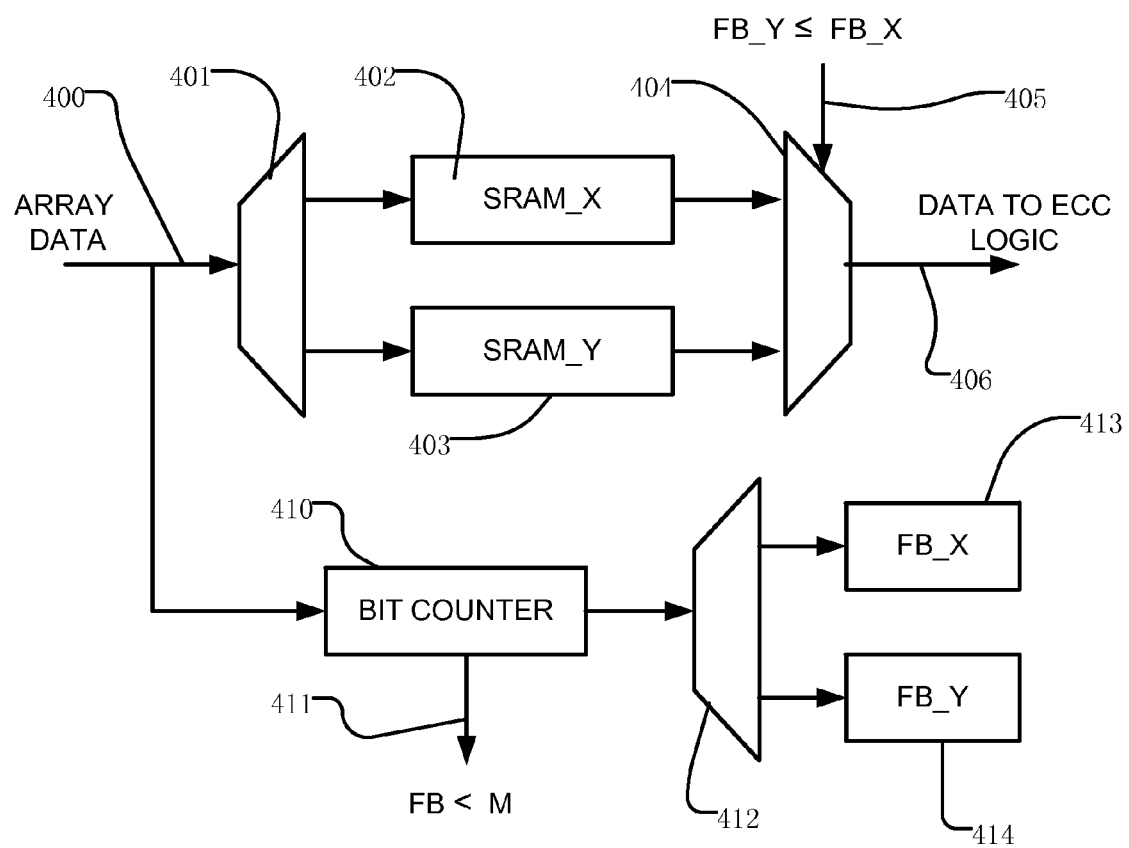
FIG. 6 is a diagram of logic, including double buffering logic, which can be used to implement a backward move.

FIG. 6 is a diagram of components of one implementation of backward move logic (e.g. logic 130 of FIG. 1) which can be used in combination with the controller 110 and other components of the memory device. In this example, array data from the page buffer for example is delivered on line 400 to a ping-pong or double buffering switch 401, where the page, or other chunk of data, delivered from the array in a given iteration of the read bias move is delivered to one the buffers 402, 403, labeled SRAM_X and SRAM_Y in the diagram. The outputs of the buffers 402, 403 are applied to inputs of a selector 404, which is used to deliver the sensed data from a selected one of the buffers 402, 403 on output line 406. The output line 406 can be coupled to the ECC logic in some embodiments, or to input/output buffers or another destination for the data.

The logic components in FIG. 6 also deliver the array data from line 400 to bit counter logic 410. The bit counter logic 410 can count the number of bits in the chunk of sensed data that have a certain data value, and the count can be compared against an expected bit count as explained above. Alternatively, other types of checksum logic can be applied to generate an indication of the number of errors detected in the current iteration. The bit counter logic 410 can produce data indicating the number of failed bits, and that data can be compared against a threshold value M. The result of the comparison (e.g. a signal on line 411) can be used by the controller 110 to determine whether to proceed with a next iteration in the read bias move operation. Also, the output of the bit counter logic 410 is supplied to a switch 412 where the failed bit count FB for the chunk of sensed data is delivered to one of the registers 413, 414. The controller 110 can utilize the data in registers 413, 414 and a backward move condition to determine whether to output the data from the buffer 402 or the buffer 403. In one example, the contents are compared, and the results of the comparison are used to generate a control signal on line 405 used to control the selector 404. In the illustrated example, if the failed bit count for buffer 403 is less than (or equal to) the failed bit count for buffer 402, then the data from buffer 403 can be delivered on line 406, and vice versa.

Figure 7:
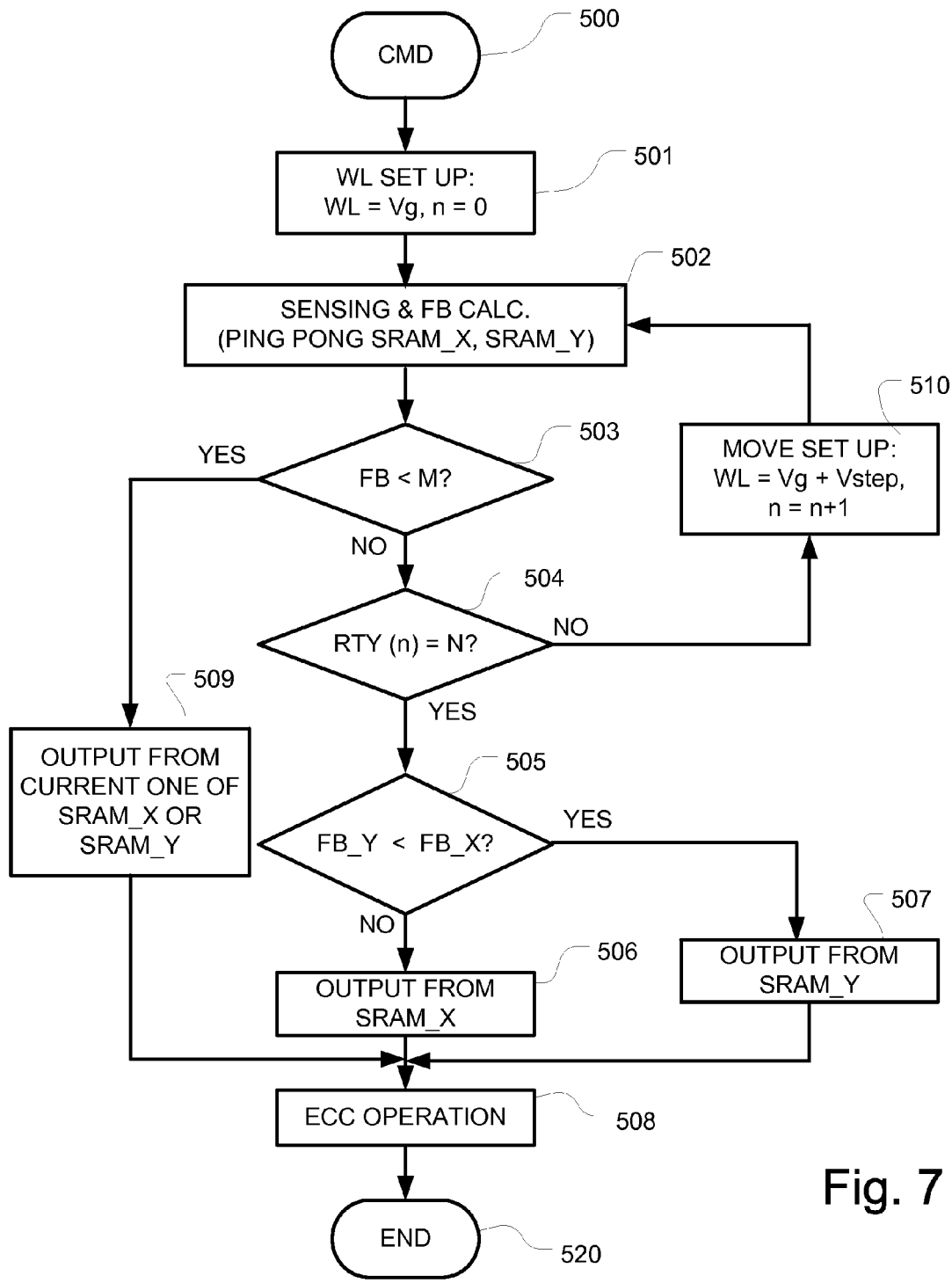
FIG. 7 is a flowchart of a method for operating a memory device, implementing a backward move.

FIG. 7 is a simplified flowchart illustrating steps which can be implemented using the controller 110, coupled with the backward move logic 130 of FIG. 1. The order of steps illustrated in FIG. 7 is illustrative. However, some of the steps can be executed in a different sequence than that shown here. In this example however, the process begins with a read page command 500. The controller implements a word line set up sequence, setting the word line voltage for the selected cell to the gate voltage Vg for first bias condition, and setting an index "n" to zero in the sequence (501). In a next step, the page of data is sensed and the failed bit FB calculation is performed while delivering the sensed data in a ping-pong fashion to one of the buffers (SRAM_X, SRAM_Y) starting with SRAM_X (502). The logic next determines whether the failed bit count is below a threshold (503). If the failed bit count is below the threshold (or equal to the threshold), then the logic determines whether the output the chunk of data in SRAM_X or SRAM_Y, using the current one of SRAM_X or SRAM_Y, which in the first iteration (n=0) can be set to SRAM_X, and in subsequent iterations (n>0) can be the one to which the current iteration output was stored (509). The data is then delivered to the ECC logic, where an ECC operation is performed (508) in the data is output to its destination.

If the failed bit count at block 503 is above the threshold M, then the logic determines whether a maximum number N of retries has been performed (504). If the maximum number of retries has been performed, then the values of failed bit count corresponding to the chunks of data in the buffers (SRAM_X, SRAM_Y) are compared (505). The data from the buffer having the lowest failed bit count is provided as output (506, 507). The data selected for output is delivered to the ECC logic, where an ECC operation is performed (508) in the data is output to its destination.

If at step 504, the maximum number of retries had not been encountered, then the read bias move is performed (510). This read bias move can be implemented by decreasing the gate voltage by a predetermined step in value, such as 5 mV or 7.5 mV as suits a particular implementation. The step in value can be constant for each iteration, or can be varied as needed to improve the performance of the sequence. Also, the read bias move involves incrementing the index "n" used to determine the number of retries.

The use of the double buffering logic results in a "backward move" where the previous iteration of the read bias move operation resulted in a lower failed bid count than the current iteration. Double buffering can be used instead of performing another read using another moved read bias condition, where the data sensed using a read bias equal to, or closer to, the first read bias (for iteration n=0) in order to improve the error rate performance of the memory is output. In this buffering approach, a backward move does not require another iteration of sensing data, and output performance can be improved. In alternatives, another iteration of sensing and failed bit counting can be executed while moving the read bias back.

The examples of the technology described herein are provided with reference to a single bit memory cell. In other implementations, the memory cells can store multiple bits per cell. In multiple-bit-per-cell embodiments, the read bias condition used in the read bias move operation can correspond to the difference between the lowest threshold range, and the next higher threshold range for example, or between the highest threshold range and the next lower threshold range. The process could be executed for each threshold range in a multi-bit cell if desired.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device including:
a non-volatile memory array storing data and ECCs;
error correcting logic; and
logic to read a data set from the memory array by performing iterations including sensing data in selected cells using a read bias, and producing an indication of errors in the sensed data, where a first iteration uses a first read bias; then
  if the indication in a current iteration is less than a threshold number of bits correctable using the ECCs, then outputting the data from the selected cells sensed in the present iteration;
  if the indication in the current iteration exceeds the threshold, then moving the read bias and performing another iteration, unless the indication in the current iteration shows an increase in errors relative to a previous iteration, in which case then outputting data from the selected cells sensed in the previous iteration; and double buffering logic to store sensed data during a current and a previous iteration;

logic to provide the sensed data from the double buffering logic to error correcting logic for correction of errors, where the memory comprises an array of memory cells having threshold voltages that indicate stored data values, said read bias includes a word line voltage, and the moved read bias includes a changed word line voltage.

2. The device of claim 1, wherein the memory cells comprise charge trapping memory cells having threshold voltages determined by trapped charge.

3. A method of operating a memory, comprising:

reading a data set from the memory by performing iterations including sensing data in selected cells using a read bias, and producing an indication of errors in the sensed data, where a first iteration uses a first read bias; then if the indication in the first iteration is less than a threshold, then outputting the data from the selected cells sensed in the first iteration;

if the indication in the first iteration exceeds the threshold, then moving the read bias and performing a second iteration, then if the indication in the second iteration is less than the threshold, then outputting the data from the selected cells sensed in the second iteration;

if the indication in the second iteration shows an increase in errors relative to the first iteration, then outputting data from the selected cells sensed in the first iteration, wherein said memory comprises an array of memory cells having threshold voltages that indicate stored data values, said read bias includes a word line voltage, and the moved read bias includes a changed word line voltage.

4. The method of claim 3, wherein the memory cells comprise charge trapping memory cells having threshold voltages determined by trapped charge.

5. A memory device including:

a memory array storing data;

logic to read a data set from the memory array by performing iterations including sensing data in selected cells using a read bias, and producing an indication of errors in the sensed data, where a first iteration uses a first read bias; then if the indication in the first iteration is less than a threshold, then outputting the data from the selected cells sensed in the first iteration;

if the indication in the first iteration exceeds the threshold, then moving the read bias and performing a second iteration, then if the indication in the second iteration is less than the threshold, then outputting the data from the selected cells sensed in the second iteration;

if the indication in the second iteration shows an increase in errors relative to the first iteration, then outputting data from the selected cells sensed in the first iteration, wherein said memory comprises an array of memory cells having threshold voltages that indicate stored data values, said read bias includes a word line voltage, and the moved read bias includes a changed word line voltage.

6. The device of claim 5, wherein the memory cells comprise charge trapping memory cells having threshold voltages determined by trapped charge.

\* \* \* \* \*